(12) United States Patent
Oh et al.

(10) Patent No.: US 7,572,704 B2
(45) Date of Patent: Aug. 11, 2009

(54) METHOD FOR FORMING METAL PATTERN AND METHOD FOR FORMING GATE ELECTRODE IN SEMICONDUCTOR DEVICE USING THE SAME

(75) Inventors: Sang-Rok Oh, Kyoungki-do (KR); Jae-Seon Yu, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/824,024

(22) Filed: Jun. 29, 2007

(65) Prior Publication Data

US 2008/0160737 A1    Jul. 3, 2008

(30) Foreign Application Priority Data

Dec. 27, 2006  (KR) .................. 10-2006-0134344
May 10, 2007  (KR) .................. 10-2007-0045288

(51) Int. Cl.
*H01L 21/336* (2006.01)

(52) U.S. Cl. .............. 438/270; 438/197; 438/272; 438/589; 257/E29.201; 257/E29.257; 257/E29.26

(58) Field of Classification Search .......... 438/197, 438/270, 272, 585, 589, 657, 669, 706, 637, 438/638; 257/E21.579, E29.257, E29.26, 257/E29.201

See application file for complete search history.

(56) References Cited

U.S. PATENT DOCUMENTS

| | | | | |
|---|---|---|---|---|
| 6,465,343 | B1 * | 10/2002 | Wang | 438/624 |
| 6,479,391 | B2 * | 11/2002 | Morrow et al. | 438/706 |
| 7,074,661 | B2 * | 7/2006 | Cho et al. | 438/197 |
| 7,078,748 | B2 * | 7/2006 | Goldbach et al. | 257/250 |
| 7,138,323 | B2 * | 11/2006 | Kavalieros et al. | 438/585 |
| 7,235,478 | B2 * | 6/2007 | Geng et al. | 438/634 |
| 2005/0095797 | A1 | 5/2005 | Cho et al. | |
| 2006/0046448 | A1 * | 3/2006 | Barns et al. | 438/585 |
| 2006/0199321 | A1 * | 9/2006 | Lo et al. | 438/197 |
| 2007/0037372 | A1 * | 2/2007 | Kavalieros et al. | 438/585 |
| 2008/0081449 | A1 * | 4/2008 | Cho et al. | 438/589 |

FOREIGN PATENT DOCUMENTS

| | | |
|---|---|---|
| CN | 1797715 A | 7/2006 |
| KR | 1020020010296 | 2/2002 |
| KR | 1020050040582 | 5/2005 |
| KR | 1020060133166 | 12/2006 |

* cited by examiner

*Primary Examiner*—Michelle Estrada
(74) *Attorney, Agent, or Firm*—Blakely, Sokoloff, Taylor & Zafman

(57) ABSTRACT

A method for forming a metal pattern in a semiconductor device includes forming an etch stop layer over a semi-finished substrate including a metal layer, forming a hard mask over the etch stop layer, etching the hard mask to form a hard mask pattern exposing the etch stop layer, and etching the etch stop layer and the metal layer using the hard mask pattern.

21 Claims, 5 Drawing Sheets

'B'

'C'

METHOD FOR FORMING METAL PATTERN AND METHOD FOR FORMING GATE ELECTRODE IN SEMICONDUCTOR DEVICE USING THE SAME

CROSS-REFERENCES TO RELATED APPLICATIONS

The present invention claims priority of Korean patent application numbers 10-2006-0134344 and 10-2007-0045288, filed on Dec. 27, 2006 and May 10, 2007, respectively, which are incorporated by reference in their entirety.

BACKGROUND OF THE INVENTION

The present invention relates to a method for fabricating a semiconductor device, and more particularly, to a method for forming a metal pattern using a hard mask and a method for forming a gate electrode in a semiconductor device using the same.

A polysilicon layer has been typically used as a gate electrode in a metal-oxide semiconductor (MOS) transistor. Such polysilicon gate electrode shows an advantage of a stable formation process. However, various patterns, including the gate electrode, have become micronized as semiconductor devices have become highly integrated. The recent micronization has reached a line width of 0.15 μm or less. Doped polysilicon, which has been used in a typical gate electrode formation, has a long delay time due to its high resistivity characteristic. Thus, it is difficult to apply the doped polysilicon in a device demanding a high speed operation.

Such difficulty has been raised as a serious limitation as semiconductor devices have become highly integrated. Thus, extensive research and developments have been recently made on an improved technology for forming a gate electrode by forming a high-melting point metal, such as tungsten (W), over polysilicon.

A typical method for forming a gate electrode in a semiconductor device using a polysilicon layer and a high-melting point metal as a gate electrode is briefly described as follows. Polysilicon and tungsten are formed as gate electrode materials over a substrate. A hard mask comprising a nitride-based layer is formed over the gate electrode. An amorphous carbon layer and a silicon oxynitride (SiON) layer functioning as an anti-reflective coating layer are formed over the hard mask. A photoresist pattern is formed over the resultant structure.

An etch process is performed to etch the anti-reflective coating layer using the photoresist pattern as an etch mask to form an anti-reflective coating pattern. Another etch process is performed to etch the hard mask using the anti-reflective coating pattern as an etch mask to form a hard mask pattern. The tungsten is etched using the hard mask pattern as an etch mask to form a gate electrode.

However, the typical method for forming a gate electrode in a semiconductor device generally shows the following limitations. A portion of the tungsten may be abnormally etched due to a low selectivity between the hard mask including the nitride-based layer and the tungsten when forming the hard mask pattern. Thus, a crack may be generated. The low selectivity between the nitride-based layer and the tungsten refers to almost not having a selectivity due to a very small difference in etch rates between the nitride-based layer and the tungsten.

FIGS. 1 and 2 illustrate micrographic views of cracks (as represented with reference denotation 'A') generated on a tungsten surface when a typical method for forming a gate electrode in a semiconductor device is applied. In particular, FIG. 1 illustrates a crack generated on a tungsten surface having a columnar rod crystal structure. The crack is often generated on the tungsten surface having the columnar rod crystal structure.

The crack generated on the tungsten surface causes an abnormally large damage on polysilicon during a subsequent etching of the polysilicon. Thus, a wedge-shaped damage may result or a pin hole may be induced in a peripheral region. The peripheral region refers to a certain region other than a region where a memory cell of a semiconductor device will be formed. Driving devices for driving the memory cell are formed in the peripheral region.

FIG. 3 illustrates a micrographic view of a wedge-shaped polysilicon damage (as represented with reference denotation 'B'). FIG. 4 illustrates a micrographic view of a pin hole (as represented with reference denotation 'C') generated in a peripheral region. Such polysilicon damage and pin hole generation may induce a short circuit between a contact plug and a gate electrode during a subsequent contact plug formation process. Thus, a yield may be substantially reduced. FIG. 5 illustrates a micrographic view of a wafer surface on which a short circuit is generated between a contact plug and a gate electrode.

SUMMARY OF THE INVENTION

Embodiments of the present invention are directed to provide a method for forming a metal pattern in a semiconductor device, which can increase a yield by reducing crack generation on a surface of a metal layer when etching the metal layer using a hard mask.

Other embodiments of the present invention are directed to provide a method for forming a gate electrode in a semiconductor device, which can increase a yield by reducing crack generation on a surface of a gate electrode during an etch process for forming the gate electrode in a semiconductor device.

In accordance with an aspect of the present invention, there is provided a method for forming a metal pattern in a semiconductor device, including: forming an etch stop layer over a semi-finished substrate including a metal layer; forming a hard mask over the etch stop layer; etching the hard mask to form a hard mask pattern exposing the etch stop layer; and etching the etch stop layer and the metal layer using the hard mask pattern.

In accordance with another aspect of the present invention, there is provided a method for forming a gate electrode in a semiconductor device, including: forming a structure including a metal layer as an upper layer; forming an etch stop layer over the metal layer; forming a hard mask over the etch stop layer; etching portions of the hard mask to form a hard mask pattern exposing the etch stop layer; and etching the etch stop layer and the metal layer using the hard mask pattern.

DESCRIPTION OF SPECIFIC EMBODIMENTS

Embodiments of the present invention relate to a method for forming a metal pattern and a method for forming a gate electrode in a semiconductor device using the same.

FIGS. 6A to 6E illustrate cross-sectional views of a method for etching a metal layer in a semiconductor device according to an embodiment of the present invention. A method for forming a gate electrode in a bulb type recess structure in a semiconductor device is described in this embodiment for convenience of description.

Figure 1:
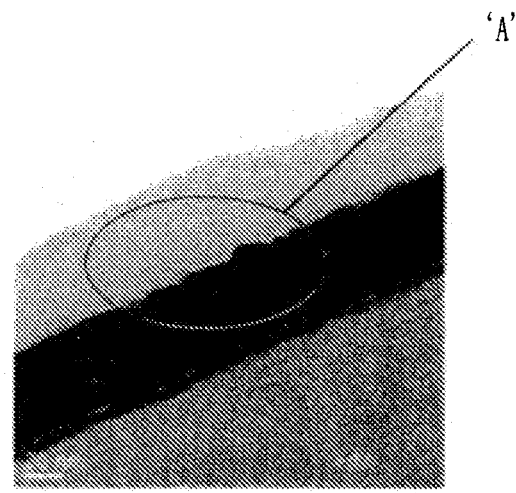
FIG. 1 illustrates a micrographic view of a crack generated on a surface of a tungsten layer having a typical columnar rod crystal structure.
Figure 2:
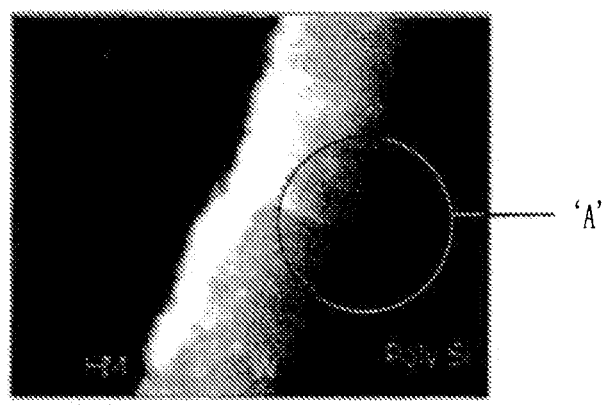
FIG. 2 illustrates a micrographic view of a crack generated on a surface of a tungsten layer for forming a gate electrode when a typical method for forming a gate electrode in a semiconductor device is applied.
Figure 3:
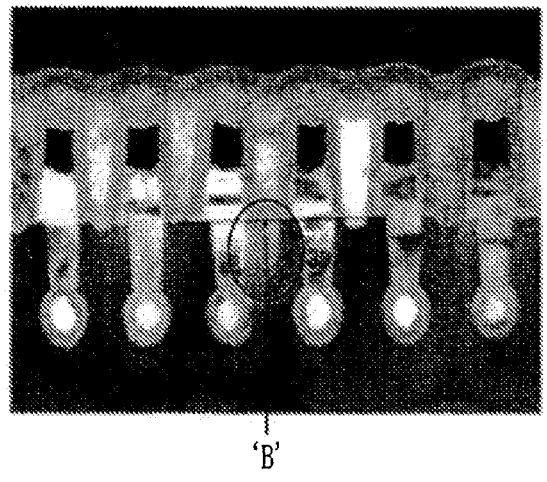
FIG. 3 illustrates a micrographic view of a wedge-shaped polysilicon damage generated when a typical method for forming a gate electrode in a semiconductor device is applied.
Figure 4:
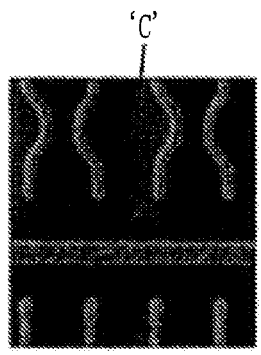
FIG. 4 illustrates a micrographic view of a pin hole generated in a peripheral region when a typical method for forming a gate electrode in a semiconductor device is applied.
Figure 5:
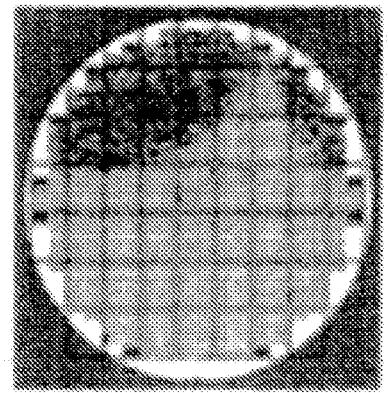
FIG. 5 illustrates a micrographic view of a wafer surface on which a short circuit is generated between a contact plug and a gate electrode when a typical method for forming a gate electrode in a semiconductor device is applied.
Figure 6A:
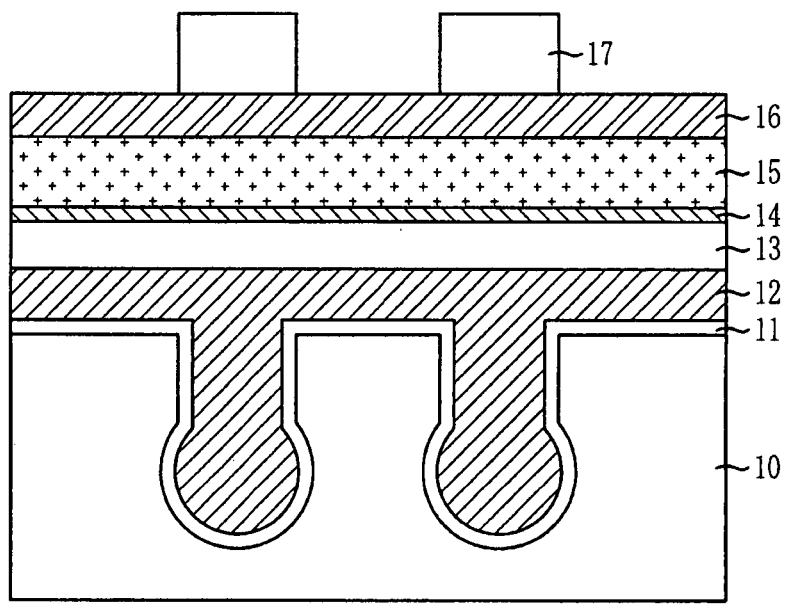
FIGS. 6A to 6E illustrate cross-sectional views of a method for forming a gate electrode in a semiconductor device according to an embodiment of the present invention.

Referring to FIG. 6A, a shallow trench isolation (STI) etch process and a wet etch process are performed to form bulb type recess regions (not shown) in a substrate 10. A gate insulation layer 11 is formed over the surface profile of the resultant structure. The gate insulation layer 11 is formed by performing a wet oxidation process, a dry oxidation process, or a radical oxidation process.

A polysilicon layer 12 is formed over the gate insulation layer 11 and fills the recess regions. The polysilicon layer 12 is formed as a first conductive layer for forming a gate electrode. The polysilicon layer 12 includes a doped or undoped polysilicon layer formed by performing a low pressure chemical vapor deposition (LPCVD) apparatus. For reference, the doped polysilicon is formed using phosphine ($PH_3$), trichloroborane ($BCl_3$), or diborane ($B_2H_6$) gas as a doping gas besides silane ($SiH_4$) gas.

The first conductive layer may include other materials other than polysilicon. The first conductive layer may include a metal layer or an alloy layer, which are conductive materials, besides polysilicon. The first conductive layer may include a stack structure configured with a metal layer and an alloy layer.

A metal layer 13 is formed over the polysilicon layer 12. In this embodiment, the metal layer 13 includes tungsten as an example. Thus, the metal layer 13 is referred to as the tungsten layer 13 hereinafter. The tungsten layer 13 is formed as a second conductive layer for forming a gate electrode. The second conductive layer may include a stack structure configured with a tungsten nitride (WN) layer, a tungsten silicide (WSi) layer, and a tungsten layer, besides the tungsten layer 13. The second conductive layer may include other materials other than tungsten. The second conductive layer may include a transition metal or a rare earth metal. The second conductive layer may include an alloy layer of a transition metal and a rare earth metal, a nitride-based layer, a silicide layer, or a combination thereof.

For instance, the transition metal may include iron (Fe), cobalt (Co), tungsten (W), nickel (Ni), palladium (Pd), platinum (Pt), molybdenum (Mo), or titanium (Ti). The rare earth metal may include erbium (Er), ytterbium (Yb), samarium (Sm), yttrium (Y), lanthanum (La), cerium (Ce), terbium (Tb), dysprosium (Dy), holmium (Ho), thulium (Tm), or lutetium (Lu).

An etch stop layer 14 is formed over the tungsten layer 13. The etch stop layer 14 may include a material having a high selectivity to a subsequent hard mask 15. For instance, the etch stop layer 14 includes a polysilicon layer having an infinitely large selectivity when the hard mask 15 includes a nitride-based material. However, the material of the etch stop layer 14 is not limited to the polysilicon layer. The material of the etch stop layer 14 may vary accordingly to the material of the hard mask 15. Thus, the etch stop layer 14 may include a material having a high selectivity to the material of the hard mask 15. Having the high selectivity refers to having a substantially large etch rate difference between different materials. Thus, under substantially the same condition, the hard mask 15 is selectively etched and the etch stop layer 14 is not etched.

When forming the etch stop layer 14 with a polysilicon layer, the polysilicon layer may include a doped polysilicon layer to change etch characteristics. Thus, it becomes possible to change the etch characteristics according to doping concentration, resulting in an easier control of the selectivity according to the material of the hard mask 15 when compared to an undoped polysilicon layer.

The etch stop layer 14 is formed to a thickness of approximately 50 Å or greater. That is, the etch stop layer 14 is formed to a thickness ranging from approximately 50 Å to approximately 1,000 Å. Although it is ideal to have the etch stop layer 14 not etched at all while etching the hard mask 15, the etch stop layer 14 is formed to such thickness because a portion of the etch stop layer 14 may be etched irrelevant to the selectivity or the limit of the selectivity between the etch stop layer 14 and the hard mask 15. That is, the thickness of the etch stop layer 14 is formed to approximately 50 Å or greater in consideration of the etch stop layer 14 being etched when etching the hard mask 15.

The hard mask 15 is formed over the etch stop layer 14. The hard mask 15 may include a material having a high selectivity to the etch stop layer 14. For instance, the hard mask 15 may include a nitride-based layer when the etch stop layer 14 includes a polysilicon layer. In detail, the hard mask 15 may include a silicon nitride ($Si_xN_y$) layer, where x representing an atomic ratio of Si and y representing an atomic ratio of N are natural numbers other than 0, which can be processed in a chamber in-situ in which the etch stop layer 14 including the polysilicon layer is processed. For instance, the hard mask 15 includes silicon nitride ($Si_3N_4$).

An anti-reflective coating layer 16 is formed over the hard mask 15. The anti-reflective coating layer 16 may include an inorganic-based anti-reflective coating layer or an organic-based anti-reflective coating layer. For instance, the inorganic-based anti-reflective coating layer may include an amorphous carbon layer or a silicon oxynitride (SiON) layer. The anti-reflective coating layer 16 may include a stack structure configured with the amorphous carbon layer and the silicon oxynitride layer. The organic-based anti-reflective coating layer is used to control interference of an ArF light source used for a micro pattern. Organic-based materials include a hardening agent for allowing an anti-reflective layer to have a bridge structure, a light absorbent for absorbing light in a wavelength range of a photo-exposure light source, and a thermal acid generator and an organic solvent as a catalyst for activating a bridge reaction.

A photoresist layer is formed over the anti-reflective coating layer 16. A photo-exposure and developing process using a photo mask is performed to form a photoresist pattern 17. The photoresist pattern 17 defines gate electrode regions where subsequent gate electrodes will be formed in a bulb type recess gate structure. The photoresist pattern 17 is formed in a manner to expose regions other than the recess regions.

Figure 6B:
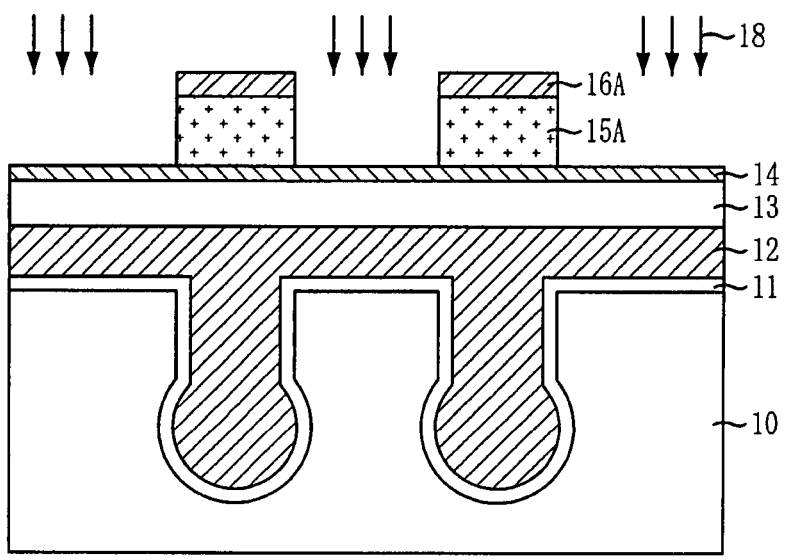

Referring to FIG. 6B, the anti-reflective coating layer 16 is etched using the photoresist pattern 17 as an etch mask. Thus, an anti-reflective coating pattern 16A is formed. An etch process 18 is performed to etch the hard mask 15 (FIG. 6A) using the anti-reflective coating pattern 16A as an etch mask. Thus, a hard mask pattern 15A is formed over the etch stop layer 14.

For instance, when the hard mask 15 includes a silicon nitride layer and the etch stop layer 14 includes a polysilicon layer, the etch process 18 uses a fluorocarbon compound which can increase a selectivity between the silicon nitride layer and the polysilicon layer. For example, a $C_xF_y$ gas, where x representing an atomic ratio of carbon (C) and y representing an atomic ratio of fluorine (F) are natural numbers other than 0, and a $C_xH_yF_z$ gas, where x representing an atomic ratio of C, y representing an atomic ratio of hydrogen (H), and z representing an atomic ratio of F are natural numbers other than 0, are used. Tetrafluoromethane ($CF_4$), hexafluoroethane ($C_2F_6$), or octafluoropropane ($C_3F_8$) may be used as the $C_xF_y$ gas. Fluoroform ($CHF_3$) may be used as the $C_xH_yF_z$ gas. Also, hydrogen ($H_2$) gas may be further added to increase the selectivity between the silicon nitride layer and the polysilicon layer. The $H_2$ gas can increase the selectivity to polysilicon. Consequently, the etch process 18 stops at an upper surface of the etch stop layer 14. Thus, the tungsten layer 13 may not be damaged when forming the hard mask pattern 15A.

As illustrated, the photoresist pattern 17 is removed while etching the hard mask 15 having a large thickness during the etch process 18. Consequently, a certain portion of the anti-reflective coating layer 16 formed below the photoresist pattern 17 may also be removed.

Figure 6C:
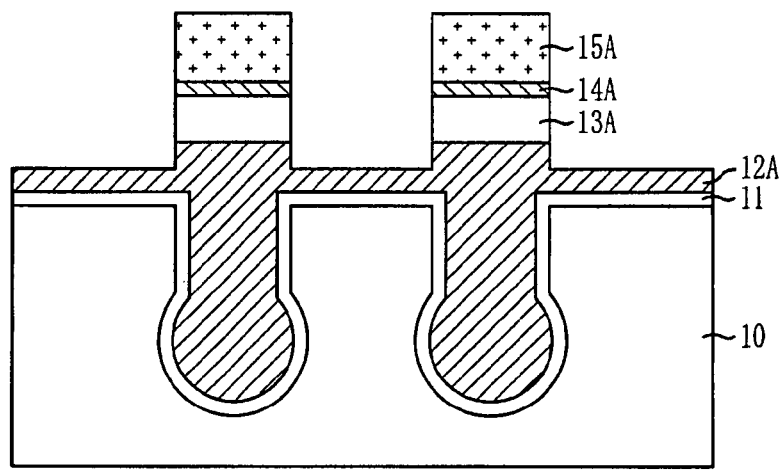

Referring to FIG. 6C, a removal process is performed to remove the anti-reflective coating pattern 16A (FIG. 6B). If portions of the photoresist pattern 17 remain, the remaining portions may be removed together with the anti-reflective coating pattern 16A.

The etch stop layer 14, the tungsten layer 13, and the polysilicon layer 12 are etched using the hard mask pattern 15A as an etch mask. The etch process is performed in a manner that a portion of the polysilicon layer 12 remains instead of completely removing the polysilicon layer 12. Thus, a remaining polysilicon layer 12A having a certain thickness remains over the substrate 10 including regions other than the gate electrode regions. Reference numerals 13A and 14A refer to a remaining tungsten layer 13A and a remaining etch stop layer 14A, respectively.

For instance, the etch stop layer 14 is etched using a transformer coupled plasma (TCP) method, an inductively coupled plasma (ICP) method, or a magnetically enhanced reactive ion etch (MERIE) method, utilizing a plasma source. Also, a source power ranging from approximately 300 W to approximately 500 W and a bias power ranging from approximately 40 W to approximately 150 W may be supplied.

Figure 6D:
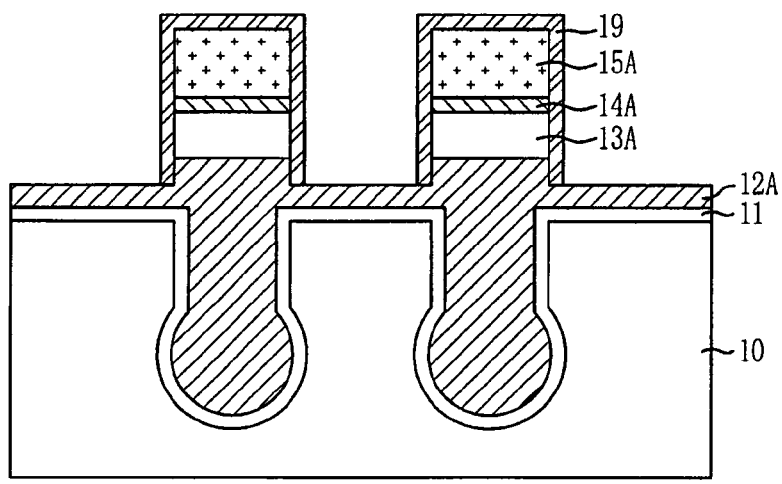

Referring to FIG. 6D, remaining capping layers 19 are formed. In more detail, a capping layer is formed over the surface profile of the resultant structure to reduce oxidation of both sidewalls of the remaining tungsten layer 13A during a subsequent re-oxidation process. The capping layer may include a material having a high selectivity to the remaining polysilicon layer 12A. For instance, the capping layer includes a nitride-based layer. For reference, the re-oxidation process refers to an oxidation process generally performed to compensate etch losses of a gate electrode, that is, sidewall losses of the gate electrode, generated during an etch process for forming the gate electrode.

A mask process and a dry etch process are performed to etch the capping layer. Thus, the remaining capping layers 19 enclosing the hard mask pattern 15A and in contact with both sidewalls of the remaining etch stop layer 14A, the remaining tungsten layer 13A, and the remaining polysilicon layer 12A are formed.

Figure 6E:
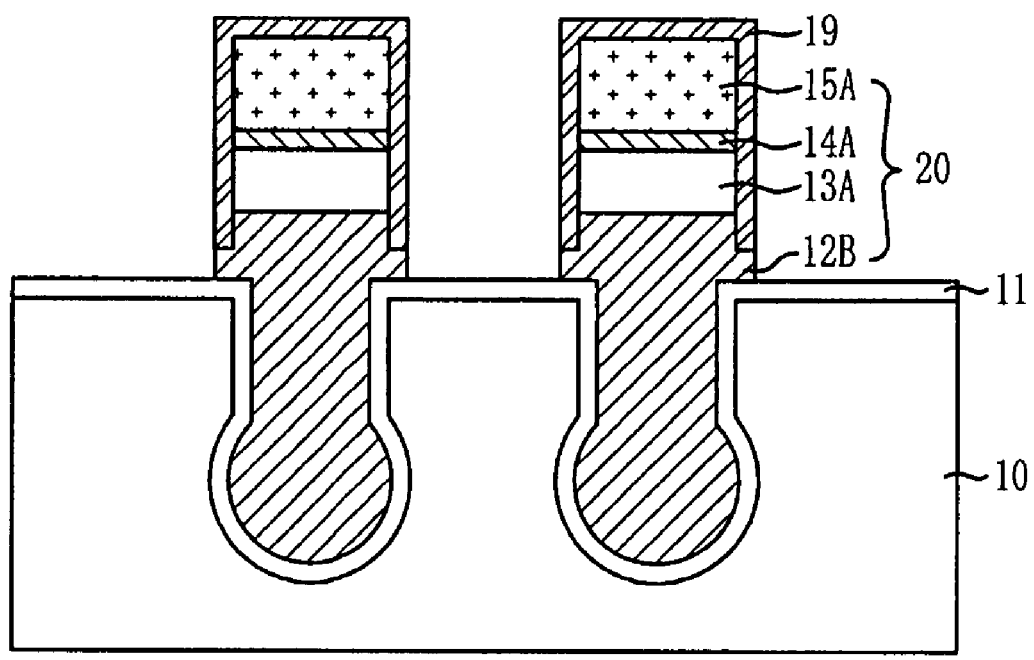

Referring to FIG. 6E, an etch process is performed to etch exposed portions of the remaining polysilicon layer 12A using the remaining capping layers 19 as an etch barrier such that portions of the gate insulation layer 11 are exposed. Reference numeral 12B refers to a patterned polysilicon layer 12B. Thus, bulb type recess gate electrodes 20 are formed.

In accordance with the embodiment of the present invention, the etch process is performed while the etch stop layer having a high selectivity is interposed between the metal layer and the hard mask during the process for etching a structure including the metal layer. Thus, the etch stop layer functions as a protective layer for protecting the metal layer to avoid a metal layer loss while etching the hard mask.

In accordance with the embodiment of the present invention, a tungsten loss may be reduced by applying the aforementioned method in the etch process of the gate electrode having the stack structure configured with the polysilicon layer and the tungsten layer. Accordingly, the crack may not be generated on a surface of the tungsten layer, and thus, a loss of the polysilicon layer below the tungsten layer and generation of a pin hole may be reduced. Furthermore, a short-circuit between the gate electrodes and a subsequent contact plug to be formed between the gate electrodes may be decreased. Thus, a yield of the semiconductor device may be increased.

In accordance with the embodiment of the present invention, the surface of the metal layer may not be oxidized by the subsequent process, e.g., re-oxidation process, by forming the capping layer over the etched surface of the metal layer.

While the present invention has been described with respect to the specific embodiments, it will be apparent to those skilled in the art that various changes and modifications may be made without departing from the spirit and scope of the invention as defined in the following claims.

What is claimed is:

1. A method for forming a metal pattern in a semiconductor device, comprising:
    forming an etch stop layer over a semi-finished substrate including a metal layer and a conductive layer below the metal layer;
    forming a hard mask over the etch stop layer;
    etching the hard mask to form a hard mask pattern exposing the etch stop layer;
    etching the etch stop layer, the metal layer and the conductive layer using the hard mask pattern;
    forming a capping layer over the hard mask pattern and over sidewalls the etched metal layer and the etched and exposed portion of conductive layer; and
    etching a remaining portion of the conductive layer not covered by the capping layer using the capping layer.

2. The method of claim 1, wherein the metal layer comprises one selected from a group consisting of a transition metal, a rare earth metal, an alloy layer including a transition metal and a rare earth metal, a nitride-based layer, a silicide layer, and a combination thereof.

3. The method of claim 1, wherein the etch stop layer comprises a material having a high selectivity relative to the hard mask such that the etch stop layer is not etched while etching the hard mask to form the hard mask pattern.

4. The method of claim 1, wherein the hard mask comprises a nitride-based layer.

5. The method of claim 1. wherein the hard mask comprises a silicon nitride layer.

6. The method of claim 5, wherein the etch stop layer comprises a polysilicon layer.

7. The method of claim 6, wherein etching the hard mask to form the hard mask pattern comprises using an etch gas including a fluorocarbon compound gas.

8. The method of claim 7, wherein the fluorocarbon compound gas comprises a $C_xF_y$ gas, where x representing an atomic ratio of carbon (C) and y representing an atomic ratio of fluorine (F) are natural numbers other than 0, or a $C_xH_yF_z$ gas, where x representing an atomic ratio of C, y representing an atomic ratio of hydrogen (H), and z representing an atomic ratio of F are natural numbers other than 0.

9. The method of claim 7, wherein etching the hard mask to form the hard mask pattern comprises using an additive gas including a hydrogen ($H_2$) gas.

10. The method of claim 1, wherein the etch stop layer comprises a doped polysilicon layer.

11. The method of claim 1. wherein the etch stop layer is formed to a thickness ranging from approximately 50 Å to approximately 1,000 Å.

12. The method of claim 1, wherein forming the hard mask comprises forming the hard mask in-situ in the same chamber as the one used for the etch stop layer.

13. The method of claim 1, further comprising, after forming the hard mask, forming an anti-reflective coating layer over the hard mask.

14. The method of claim 13, wherein the anti-reflective coating layer comprises one of an inorganic-based anti-reflective coating layer and an organic-based anti-reflective coating layer.

15. The method of claim 13, wherein the anti-reflective coating layer comprises one of an amorphous carbon layer and a stack structure including an amorphous carbon layer and a silicon oxynitride layer.

16. The method of claim 1, wherein the conductive layer is etched so that a portion of the conductive layer remains instead of completely removing the conductive layer.

17. The method of claim 1, wherein the conductive layer is formed in a bulb type structure and a portion of the conductive layer fills a recess region within a substrate.

18. The method of claim 1, wherein the conductive layer comprises one of a doped polysilicon layer and an undoped polysilicon layer.

19. The method of claim 1, wherein the capping layer comprises a nitride-based layer.

20. The method of claim 1, wherein etching the etch stop layer comprises using a transformer coupled plasma (TCP) method, an inductively coupled plasma (ICP) method, or a magnetically enhanced reactive ion etch (MERIE) method.

21. The method of claim 20, wherein etching the etch stop layer comprises using a plasma source, wherein a source power ranging from approximately 300 W to approximately 500 W and a bias power ranging from approximately 40 W to approximately 150 W are supplied.

* * * * *